United States Patent [19]

Curtin

[11] Patent Number: 5,456,402
[45] Date of Patent: Oct. 10, 1995

[54] FLEXIBLE FIXTURE FOR SMT BOARD

[75] Inventor: Mark Curtin, Chelmsford, Mass.

[73] Assignee: Transition Automation, Inc., N. Billerica, Mass.

[21] Appl. No.: 222,523

[22] Filed: Apr. 4, 1994

[51] Int. Cl.[6] .............................. B23K 1/008; H05K 3/34
[52] U.S. Cl. ............................................................ 228/43
[58] Field of Search ................................ 228/43, 49.5, 57

[56] References Cited

U.S. PATENT DOCUMENTS 4,759,488  7/1988  Robinson et al. ..................... 228/43

*Primary Examiner*—Kenneth J. Ramsey
*Attorney, Agent, or Firm*—Samuels, Gauthier & Stevens

[57] ABSTRACT

A flexible fixture for holding a printed circuit board, particularly for reflow soldering of surface mount components on both sides of printed circuit boards. This is provided by a sturdy frame having on the inside lip a stepped recess for receiving the edge of a printed circuit board, the frame being provided as a kit of parts including four corner frame segments. Longitudinal tracks in the arms of the corner frame segments slidably receive side bars which are adjustably locked in place by screws. Locater devices, clamps and intermediate board support posts are additionally disclosed for attachment to the frame.

21 Claims, 4 Drawing Sheets

FLEXIBLE FIXTURE FOR SMT BOARD

FIELD OF THE INVENTION

A fixture hold PCB during the process steps to a of printing a solder pattern on the board, mounting components on the board, and reflowing the solder. The fixture is particularly adapted for double-sided SMT.

BACKGROUND AND BRIEF SUMMARY OF THE INVENTION

One of the key advantages of double-sided SMT is the potential of populating both sides of the PCBs with surface mount components. Double-sided SMT provides a two-fold increase in potential interconnection density and product density. However, there are many process problems which limit the use of double-sided SMT.

Currently, double-sided SMT technology has difficulties with the process tooling necessary to print, place components and reflow with high reliability. Obviously, the second side of a PCB is in essence a different board. A separate stencil is needed, a different pick and place setup is required and a separate reflow profile is necessary.

Unlike a single-sided board, the second side of an SMT board must be processed with a finished assembly affixed to the first side. Associated problems include component damage, warpage from reflow sagging and lack of support during printing and reflow. Further, double-sided SMT results in decisions regarding which side to print first, where the board support will be, warpage after first side reflow, more severe warpage at second side reflow, i.e. more weight. Further, second side reflow can need more heat time or higher set temperatures.

There are fixtures currently available to hold PCBs, i.e. PCB workboard holders and flow solder carriers, which are adjustable along the X, Y axes. However, these currently available fixtures are typically large and cumbersome and in most instances are custom designed for specific PCB applications. Further, they are generally characterized by their lack of total peripheral support of the PCB and lack of point support within the outline of the PCB to prevent flexing. Further, prior art fixtures generally use off-the-shelf components with invariably protruding features on their periphery and extending above the plane of the PCB. There still exists the combined problems of board support, flat profile and adjustability.

The present invention embodies a universal adjustable rectangular fixture for PCBs. The invention comprises a kit of structural members which can be assembled to form a fixture of substantially unlimited dimensions which correspondingly can support variously dimensioned PCBs. The fixture of the invention avoids the necessity of custom designing fixtures for individual PCBs and for PCB processing machines. The fixture of the invention when adjusting inwardly or outwardly along the X and Y axis always maintains a square or rectangular perimeter without extending projections.

The kit, in one embodiment, comprises at least four corner frames at least one of which has a location hole and/or positioning pin, a plurality of adjusting bars which in use are slidably received in the corner frames and means to lock the members rigidly together as a fixture. In a preferred embodiment, the kit comprises at least two side frames and at least one vertical support block adapted to engage a support bar. When the side frames are used the support bars are slidably received therein.

In the present invention, there is adjustability of the fixture not only in the X, Y axes but also in an r-θ axis for tooling pins for PCB alignment. Further, there is adjustable vertical support for the PCB along the X, Y and Z axes. The fixtures have a flush top surface, either coplanar with the top surface of the PCB or recessed with reference to the top surface of the PCB. There are no extending features beyond the rectangular perimeter so that the fixture itself can easily feed into processing equipment. Further, with the fixture of the invention, the PCB can remain in situ during the printing of the solder pattern, the placement of the components and the reflow step.

In a preferred embodiment, the fixture of the invention is adjustable along X, Y axes, it has a flat receding profile, a movable locator pin(s) array, an adjustable center vertical support(s) along X, Y and Z axes, high-rigidity, light-weight and high heat absorption with low thermal mass.

The fixture of the invention can be passed from the printing stage through component placement and into oven processing. The invention eliminates warpage after first side heating which typically causes problems with the second side printing and placement of parts. The PCBs in the fixture are vertically supported "raised" to prevent sagging and components originally placed in the first side are protected from being contacted and damaged. Preferably, the board has point supports at least every four square inches to prevent flexing while the PCB/fixture is being printed.

During reflow, on the second side, the board tends to warp more severely than during the first side processing, because of the additional weight of having components on both sides of the board. The fixture in the invention supports such an assembly. Handling of any SMT board after printing and placement is a challenge since the parts, in the printed pattern are close to the edge of the board. If the board is dropped or if parts are touched or the print is smeared, it can require expensive and time consuming rework. A fixture which moves the handling points away from the board outline is important.

The fixture of the invention provides a continuous protected PCB perimeter, such that the fixture extends the perimeter of the board so that the components no longer sit close to the handling edges. Further, at least fifty percent (50%) edge support and multiple adjustable vertical point support in three dimensions is provided. The structure has a profile equal to or less than the board such that it does not interfere with the application of a solder pattern thereto while in the fixture. There is an overlapping slot length/hole spacing pattern which maximizes rigidity and hole alignment. In an alternative embodiment, the fixture includes a rotatable lip which swings upwardly and outwardly to be engaged by edge grabbing conveyor systems.

DESCRIPTION OF THE PREFERRED EMBODIMENT(S)

Figure 1:
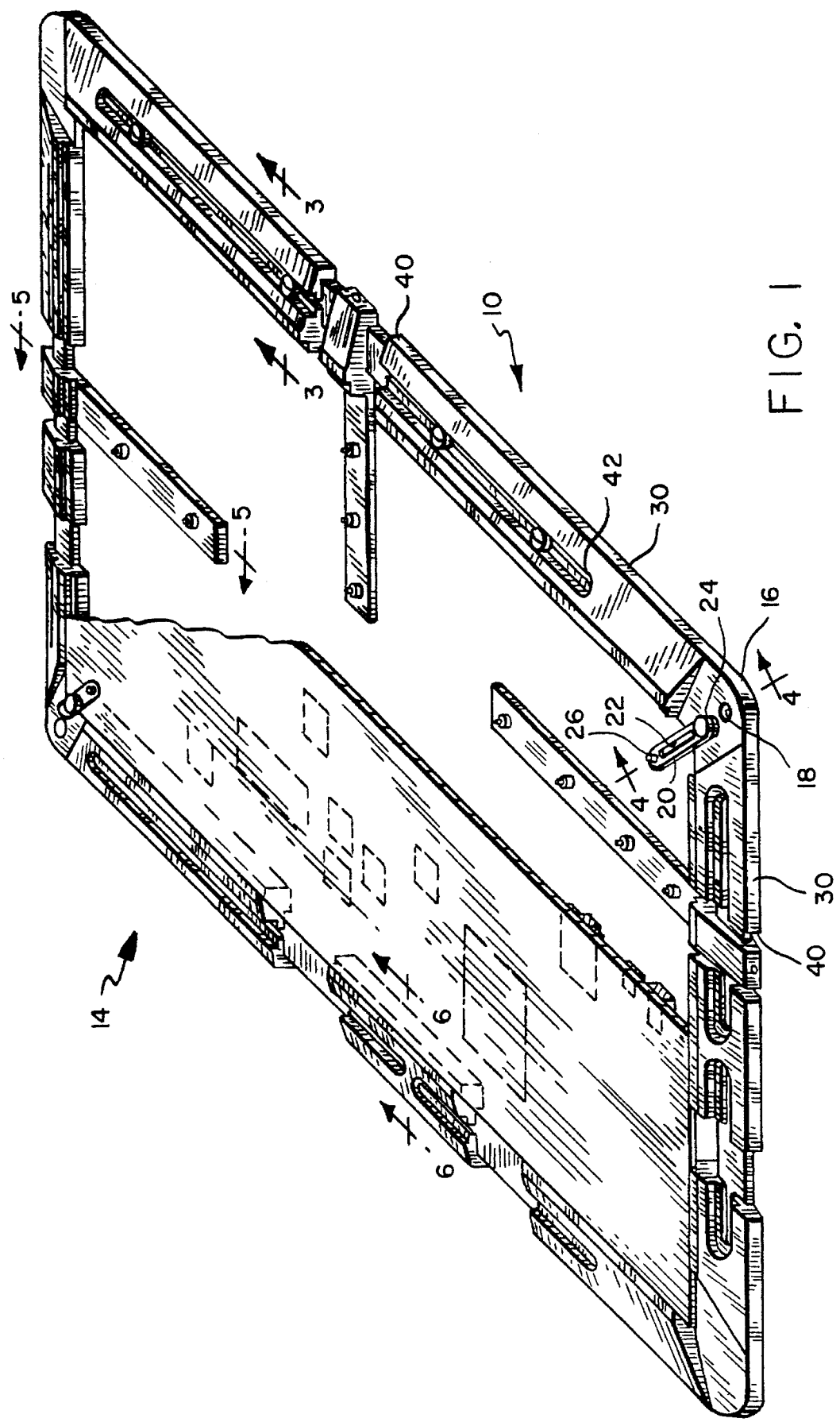
FIG. 1 is a perspective view of a fixture embodying the invention.
Figure 2:
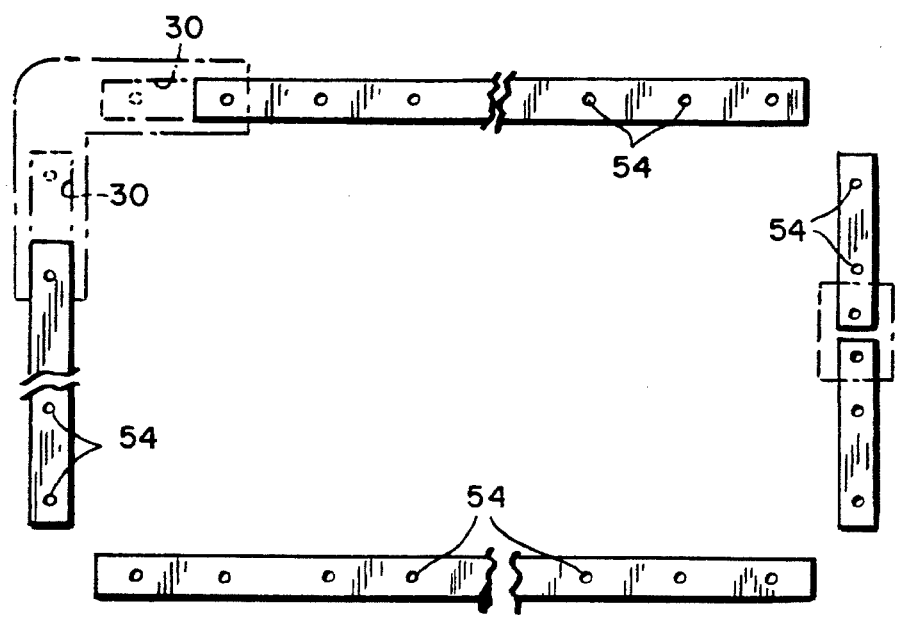
FIG. 2 is a sectional view of FIG. 1 taken along lines 2—2.

Referring to FIG. 1, a fixture 10 embodying the invention is shown generally and a prior art PCB is shown in dotted lines. The fixture 10 comprises corner frames 12, side frames 50, vertical supports 80, all joined and locked to adjusting bars 100. The corner frame 12 comprises an inner wall 14 and an outer wall 16. Further, the corner frame 12 comprises a joint 18, shown in greater detail in FIG. 2, formed integrally with two arms 30.

The joint 18 comprises a locator hole 20 and a r-θ arm 22. The r-θ arm 22 is characterized by a slot 24, has a locator pin 26, at one end and is secured to the joint 18 at its other end by a screw 28.

Figures 3, 4:
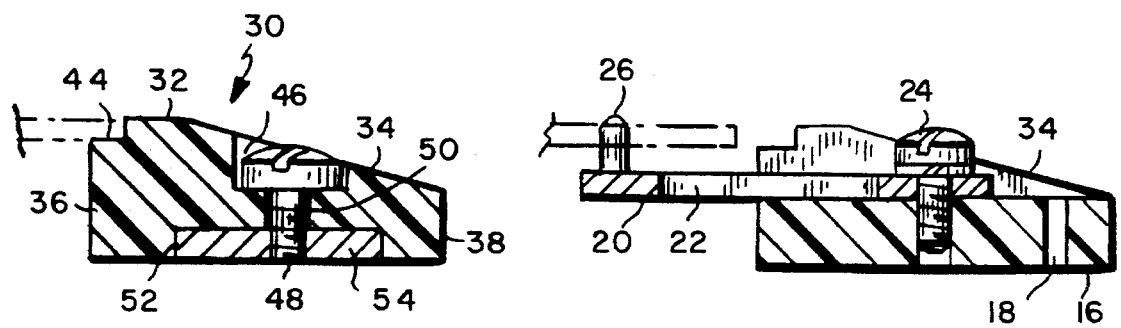
FIG. 3 is a sectional view of FIG. 1 taken along lines 3—3.
FIG. 4 is a sectional view of FIG. 1 taken along lines 4—4.

Referring to FIGS. 1 and 3, the arms 30 include a flat surface 32 and a champered surface 34. The flat surface 32 joins the inner wall 14 to form a seat 36. The arms terminate in an end wall 38. Shown most clearly in FIG. 3, the arm includes a I-beam section formed therein which section comprises a slot 40, a neck 42 and a track 44. As shown in FIG. 1, the slot extends from the end wall 38 inwardly and terminates in a recessed wall 46.

Referring to FIGS. 1 and 4, a side frame member 50 is shown and comprises a center wall 52, an inner wall 54, an outer wall 56, a flat surface 58, a champered surface 60, slot 62, a stepped surface 64 where the flat surface and the inner wall 54 are joined and arms 66. In cross section, the arms 66 of the side frame 50 are dimensionally identical to the arms 30 of the corner frame 12.

Figure 5:
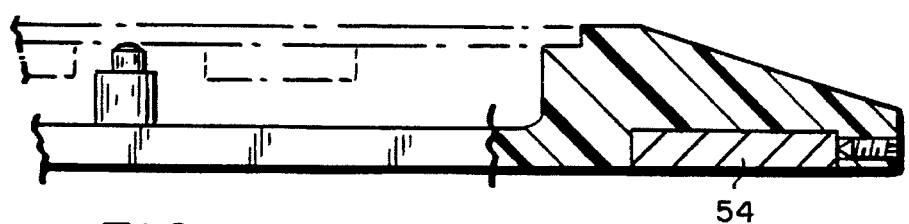
FIG. 5 is a sectional view of FIG. 1 taken along lines 5—5.

Referring to FIGS. 1 and 5, the vertical support 80 comprises a slot 84, which slot in cross section is dimensionally identical to the slot 40 of the arms 30 and the slot 62 of the arms 66. The vertical support 80 further comprises an inwardly extending arm 86 characterized by vertically upwardly extending pins 88 which pins, as desired, may be removed and/or replaced with pins of greater or lesser height than shown. A set screw 90 is received in the outer wall 92 of the vertical support 80.

Figure 6:
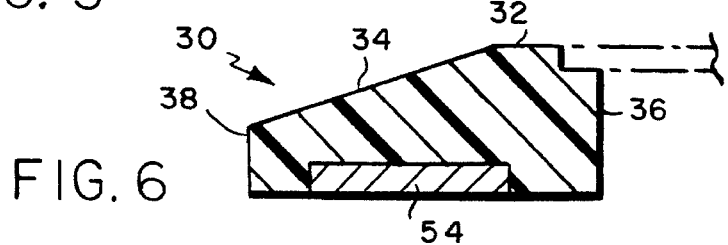
FIG. 6 is a schematic of an array of adjusting bars and frame members.

As shown most clearly in FIGS. 1 and 6, adjusting bars 100 characterized by tapped holes 102 are slidably received in the slots 40, 62 and 84 and are secured therein by screws 94. The corner frames 12 and side frames 50 are secured to the adjusting beams 100 by the screws 94. Depending upon the dimension of the PCB to be secured to the fixture, any rectangular size PCB board can be accommodated with the fixture 10 as long as it's dimensions are between the inner and outer limits of the slots.

As will be understood by those skilled in the art, the specific dimensioning of the fixture, particularly in regard to the extension and retraction along the X and Y axes, will be limited in its retracted state along any axis when the end of an adjustable bar member contacts the recessed wall of an arm of a corner member and contacts either the recessed wall of an adjacent arm of a corner member or the center wall of an adjacent side frame. It is preferable that when an adjusting bar is in its extended position with reference to the arm with which it is engaged that there be at least two tapped holes in which the screws may secure the arm to the adjustable bar member. However, the bars and mating tracks are machined to high accuracy eliminating the need for substantial bar/corner member overlap in order to obtain strength and rigidity. As designed and machined, the bars can be extended nearly full length with just one locking screw securing the same.

Figure 7:
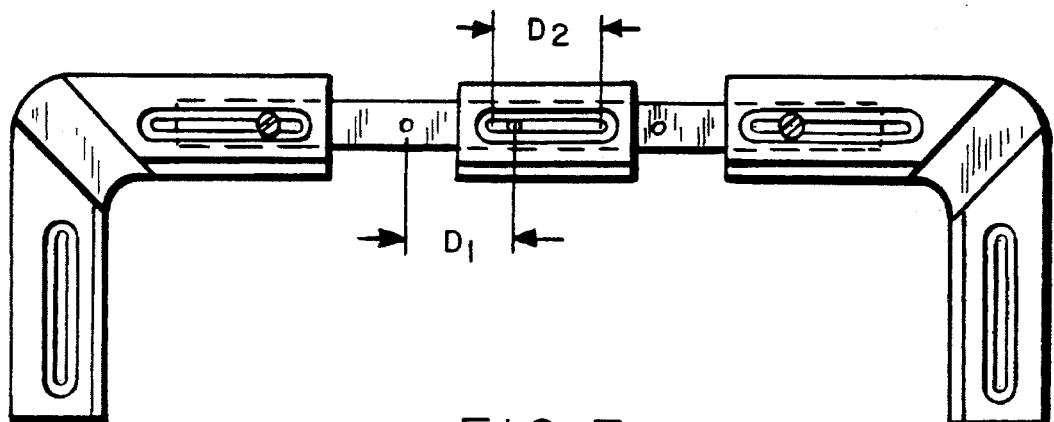
FIG. 7 is a plan view illustrating the relationship of the slot lengths and hole spacings.

As shown in FIG. 7, the length of $D_2$ of any of the slots is greater than the distance $D_1$ between adjacent tapped holes 102. This ensures that when the fixture 10 is in its fully extended position, (along its X-Y axis) with or without side frame members 50, there will always be at least one tapped hole per slot.

Preferably the relative dimensioning of the length of a corner joint which can accept the length of an adjusting bar would be about three inches.

The length of the arm 86 of the vertical support 80 and its location on an adjusting bar including the number of vertical posts 88 on the arm 86 will depend upon the position of the components on the underside of the PCB and the expected warpage that would occur for the particular board in the fixture 10.

Once the vertical supports have been determined for a particular PCB board the length and width of the fixture is adjusted such that the PCB board will be supported both by the vertical posts 88 and the seats 36 formed in the arms 30, the seats 64 formed in the arms 60 and the seats 89 formed in the vertical supports 80. After the PCB has been positioned and secured in place, the screws 94 and set screws 90 are tightened to fasten the PCB in the fixture.

In certain situations it is important that the PCB, in addition to being supported to prevent movement in the X-Y plane and to prevent downward deflection, must also be held down in place. These situations can occur, for example when the stencil is removed from the PCB or if the PCB is warped.

Figure 8:
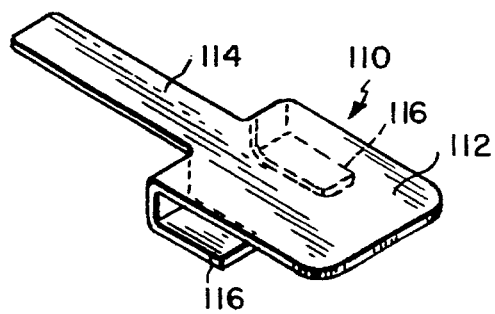
FIG. 8 is an isometric view of a board hold-down clip.

Referring to FIG. 8, an isometric view of spring-biased holding clip 110 which comprises a plate 112 from which extends a tounge 114 which engages the upper surface of the PCB. The clip 110 also comprises lips 116 which snap into and frictionally engage a slot which slot can be any of the slots 40 of the arms 30 and/or the slots 62 of the side frame members 50. To release the clip 110 the rearward portion of the plate 112 is raised or lowered.

Figure 9:
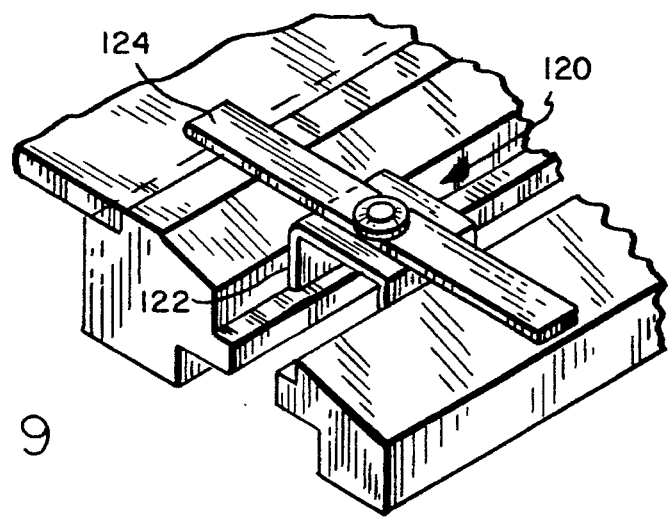
FIG. 9 is an isometric view of an alternative embodiment of a hold-down clip.

An alterative embodiment of a hold-down clip 120 is illustrated in FIG. 9 and comprises a press clip 122 which is snapped into slots 40 and/or 62. Rotatably pinned to the clip 122 is a hold-down arm 124. After a PCB has been positioned the clip 120 is inserted into a slot, and the arm 124 is rotated over the PCB to hold down the same.

Figure 10:
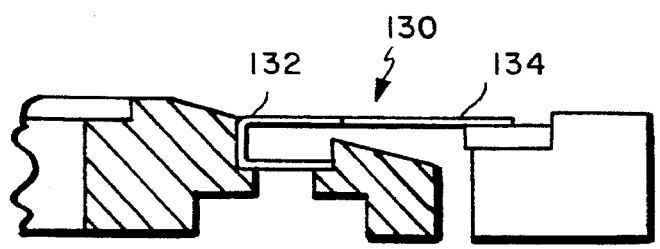
FIG. 10 is a schematic of a fixture of the invention with paired lips for engagement with edge grabbing equipment.
Figure 11:
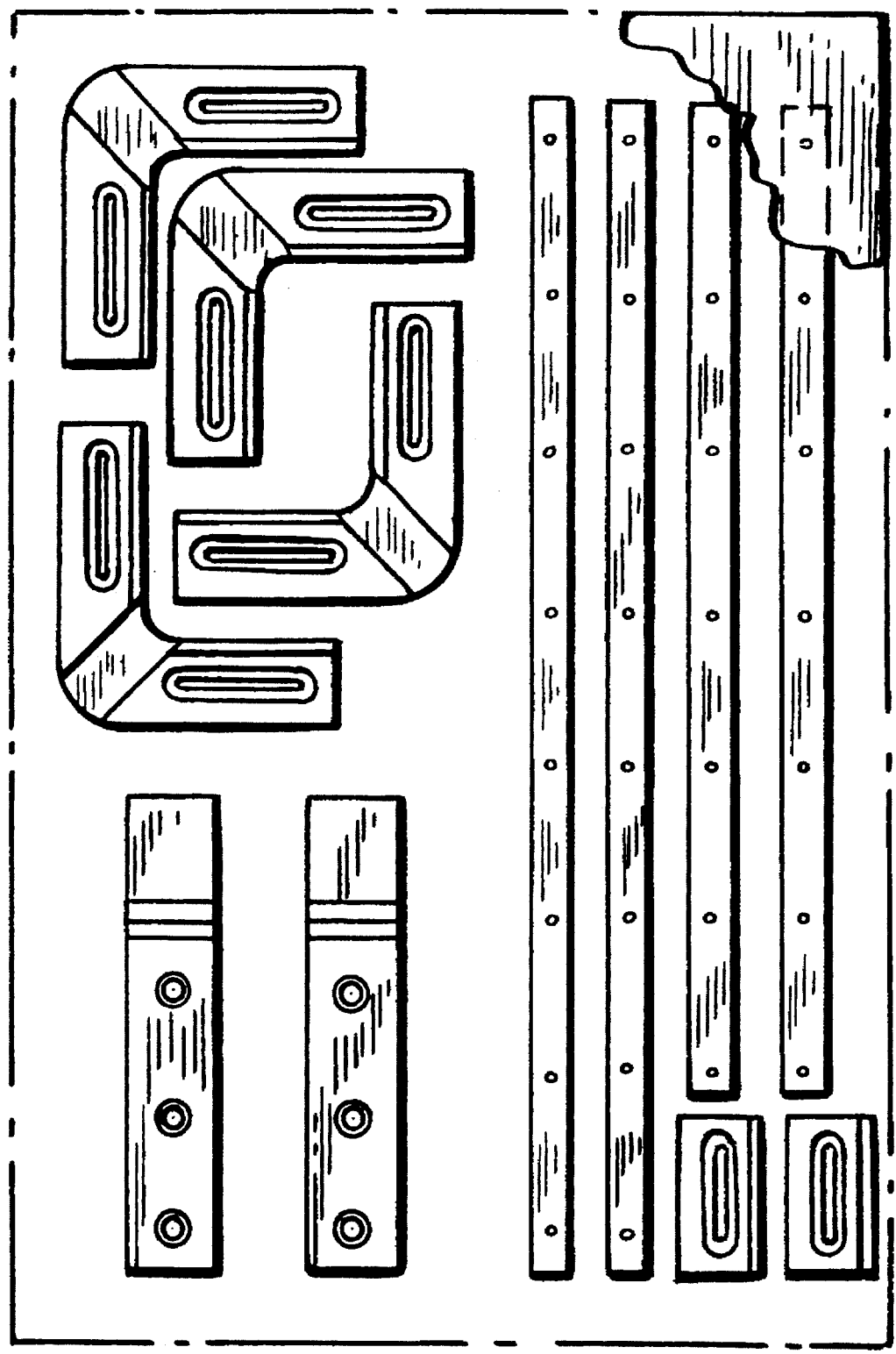
FIG. 11 is a schematic of a kit embodying the invention.

FIG. 10 illustrates an edge feed clip 130 to allow edge feeding for PCB placement equipment. The clip 180 comprises a U-shaped snap 132 which engages the slots 40 and/or 62 and an extending arm 134 adapted to be engaged for edge rail feeding.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A substantially rectangular fixture for use in a SMT process which comprises:

a plurality of corner frames, each corner frame having an outer wall, a joint and two arms extending therefrom, the arms characterized by a longitudinal track formed therein, said track extending inwardly from the ends of the arm toward the joint, the outer walls of the frames lying in a plane which defines a rectangle, the arms having an inner wall and an upper surface, which upper surface terminates in a step at the inner wall, the step dimensioned to support the edge of a PCB such that the top surface of the PCB is substantially coplanar with or relatively higher than the top surface of the arms;

a plurality of bars slidably engaged to the tracks to form with the corner frames the fixture; and means to reposition the corner frames along X and/or Y axes and to lock the corner frames to the bars.

2. The fixture of claim 1 wherein the bars are received in the tracks and lie within the rectangular plane defined by the outer walls of the corner frames.

3. The fixture of claim 1 wherein the joint of the corner frame has a locating arm adapted to move in an R-θ direction and a locator pin extends therefrom, said pin adapted to engage a locator hole in a PCB board.

4. The fixture of claims 1, 2 or 3 which comprises:

a vertical support block secured to at least one of the bars, the vertical support block comprising an upper surface and an inner edge, the vertical block having an outer wall which is coincident with or within the plane of the rectangle defined by the outer walls of the corner frames, the vertical block including an arm extending inwardly with reference to the defined rectangle and under the plane within which a PCB board would lie, the arm including a vertical support post adapted to engage the underside of a PCB.

5. The fixture of claim 4 wherein the vertical support block comprises an inner wall and the upper surface terminates at the inner wall in a step, which step dimensionally corresponds to the step in the corner frames to support the edge of the PCB board.

6. The fixture of claim 1 wherein the arms are characterized by a longitudinal I-beam shape when viewed in cross section comprising a slot formed in the upper surface of the arms and a neck which joins the slot to the longitudinal track; and wherein the means to reposition and lock the corner frames to the bars comprises threaded members which pass through the slot and the neck.

7. The fixture of claim 6 wherein the bars comprise a plurality of spaced tapped holes, the holes in register with the slot when the bar is received in the longitudinal track.

8. The fixture of claim 7 wherein the tapped holes are spaced such that one tapped hole is always in register with a slot.

9. The fixture of claim 1 wherein the upper surface of the arms comprises a flat section, which flat section extends inwardly to form the step and a champered section which extends from the flat section to the outer wall.

10. The fixture of claim 1 which comprises:

a side frame member having a central portion and arms extending outwardly along a linear axis from said central portion, the arms corresponding dimensionally to the arms of the corner frame members and including slots adapted to slidably receive the ends of the bars; and means to reposition and lock the side frame with reference to the bars along X and Y axes.

11. The fixture of claim 1 wherein the joint of the corner frame is characterized by a locator hole to position the fixture.

12. The fixture of claim 1 wherein the corner members are secured such that the opposed ends of the arms of the corner members are spaced to define an opening therein whereby access may be gained to the edge of the PCB board to remove the board from the fixture while the fixture is in its locked position.

13. A kit for a fixture for use in a SMT process which kit comprises:

a plurality of corner frames, each corner frame having an outer wall, a joint and two arms extending therefrom, the arms characterized by a longitudinal track formed therein, said track extending inwardly from the ends of the arm toward the joint, the arms having an inner wall and an upper surface, which upper surface terminates in a step at the inner wall, the step dimensioned to support the edge of a PCB such that the top surface of the PCB is substantially coplanar with or relatively higher than the top surface of the arms;

a plurality of bars adapted to slidably engage the tracks of the corner frames; and means to reposition and lock the corner frames to the bars.

14. The kit of claim 13 wherein the arms are characterized by a longitudinal I-beam shape when viewed in cross section including a slot formed in the upper surface of the arms and a neck which joins the slot to the longitudinal track; and wherein the means to reposition and lock the corner frames to the bars comprises threaded members which pass through the slot in the neck.

15. The fixture of claim 14 wherein the bars comprise a plurality of spaced tapped holes, the holes in register with the slot when the bar is received in the longitudinal track.

16. The kit of claim 15 wherein the tapped holes are spaced such that one tapped hole is always in register with a slot.

17. The kit of claim 13 which comprises at least one locating arm having a locator pin extending therefrom, said pin adapted to engage a locator hole in a PCB board and the arm adapted to be secured to the joint.

18. The kit of claim 13 which comprises:

a least one vertical support block adapted to be secured to at least one of the bars, comprising an upper surface and an inner edge, and an outer wall and including an arm, the arm having a vertical support post adapted to engage the underside of a PCB.

19. The kit of claim 18 wherein the upper surface of the arms comprises a flat section, which flat section extends inwardly to form the step and a champered section which extends from the flat section to the outer wall.

20. The kit of claim 13 which comprises:

a side frame member having a central portion and arms extending outwardly along a linear axis from said central portion, the arms corresponding dimensionally to the arms of the corner frame members and including slots adapted to slidably receive the ends of the bars; and means to reposition and lock the side frame with reference to the bars along X and Y axes.

21. The kit of claim 13 wherein the joint of the corner frame is characterized by a locator hole to position the fixture.

* * * * *